(12) United States Patent
Roberge

(10) Patent No.: US 10,323,325 B2
(45) Date of Patent: Jun. 18, 2019

(54) LIGHT WEIGHT HOUSING FOR INTERNAL COMPONENT AND METHOD OF MAKING

(71) Applicant: UNITED TECHNOLOGIES CORPORATION, Farmington, CT (US)

(72) Inventor: Gary D. Roberge, Tolland, CT (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 96 days.

(21) Appl. No.: 15/096,664

(22) Filed: Apr. 12, 2016

(65) Prior Publication Data
US 2017/0292194 A1 Oct. 12, 2017

(51) Int. Cl.
*B23H 1/08* (2006.01)
*B23H 9/00* (2006.01)
(Continued)

(52) U.S. Cl.
CPC ............. *C23C 28/30* (2013.01); *B22F 5/006* (2013.01); *B22F 7/006* (2013.01); *B23H 1/08* (2013.01); *B23H 9/00* (2013.01); *B23K 26/36* (2013.01); *B23K 26/40* (2013.01); *B23K 26/402* (2013.01); *B32B 5/18* (2013.01); *B32B 5/20* (2013.01); *B32B 5/32* (2013.01); *B32B 15/01* (2013.01);
(Continued)

(58) Field of Classification Search
CPC ... B23P 15/26; B23P 2700/09–2700/10; F28F 1/10; F28F 1/12; F28F 13/003; F28F 21/089; F28F 2255/00; Y10T 29/4935; Y10T 29/49377; Y10T 29/49629; E04B 2002/0286; B32B 5/32; B32B 15/046; B32B 2255/062; F01D 25/005; F05D 2300/612; F05D 2230/31–2230/314; F05D 2230/90
See application file for complete search history.

(56) References Cited

U.S. PATENT DOCUMENTS 3,261,733 A 7/1966 Bellinger
3,470,117 A 9/1969 Pearce
(Continued)

FOREIGN PATENT DOCUMENTS

DE 19526057 C1 4/1996
DE 202004018594 U1 2/2005
(Continued)

OTHER PUBLICATIONS

Translation of DE19526057, generated Jul. 24, 2018.*
(Continued)

*Primary Examiner* — Matthew P Travers
(74) *Attorney, Agent, or Firm* — Cantor Colburn LLP

(57) ABSTRACT

A method of making a light weight housing for an internal component is provided. The method including the steps of: forming a first metallic foam core into a desired configuration; forming a second metallic foam core into a desired configuration; inserting an internal component into the first metallic foam core; placing the second metallic foam adjacent to the first metallic core in order to secure the internal component between the first metallic foam core and the second metallic foam core; and applying an external metallic shell to an exterior surface of the first metallic foam core and the second metallic foam core.

18 Claims, 9 Drawing Sheets

(51) Int. Cl.

| | | |
|---|---|---|
| *B32B 5/18* | (2006.01) | |
| *B32B 5/32* | (2006.01) | |
| *C23C 4/02* | (2006.01) | |
| *C23C 4/08* | (2016.01) | |
| *C25D 3/12* | (2006.01) | |
| *C25D 3/38* | (2006.01) | |
| *C25D 3/42* | (2006.01) | |
| *C25D 3/44* | (2006.01) | |
| *C25D 3/54* | (2006.01) | |
| *C25D 3/56* | (2006.01) | |
| *B23K 26/36* | (2014.01) | |
| *B22F 5/00* | (2006.01) | |
| *B22F 7/00* | (2006.01) | |
| *B32B 5/20* | (2006.01) | |
| *C22C 1/08* | (2006.01) | |
| *C23C 4/10* | (2016.01) | |
| *C23C 28/00* | (2006.01) | |
| *B23K 26/40* | (2014.01) | |
| *C23C 14/02* | (2006.01) | |
| *C23C 14/06* | (2006.01) | |
| *C23C 14/16* | (2006.01) | |
| *C23C 14/22* | (2006.01) | |
| *C23C 4/129* | (2016.01) | |
| *C23C 4/134* | (2016.01) | |
| *C23C 16/06* | (2006.01) | |
| *B32B 15/04* | (2006.01) | |
| *B32B 15/01* | (2006.01) | |
| *F01D 25/00* | (2006.01) | |
| *B23K 26/402* | (2014.01) | |
| *B22F 3/16* | (2006.01) | |
| *F28F 1/12* | (2006.01) | |
| *B23K 101/18* | (2006.01) | |
| *B23K 103/04* | (2006.01) | |
| *B23K 103/08* | (2006.01) | |
| *B23K 103/14* | (2006.01) | |
| *B23K 103/00* | (2006.01) | |
| *F28F 13/00* | (2006.01) | |
| *B23K 103/18* | (2006.01) | |

(52) U.S. Cl.
CPC .............. *B32B 15/046* (2013.01); *C22C 1/08* (2013.01); *C23C 4/02* (2013.01); *C23C 4/08* (2013.01); *C23C 4/10* (2013.01); *C23C 4/129* (2016.01); *C23C 4/134* (2016.01); *C23C 14/024* (2013.01); *C23C 14/028* (2013.01); *C23C 14/0682* (2013.01); *C23C 14/16* (2013.01); *C23C 14/221* (2013.01); *C23C 16/06* (2013.01); *C25D 3/12* (2013.01); *C25D 3/38* (2013.01); *C25D 3/42* (2013.01); *C25D 3/44* (2013.01); *C25D 3/54* (2013.01); *C25D 3/56* (2013.01); *C25D 3/562* (2013.01); *C25D 3/565* (2013.01); *F01D 25/005* (2013.01); *B22F 3/162* (2013.01); *B23K 2101/18* (2018.08); *B23K 2103/04* (2018.08); *B23K 2103/08* (2018.08); *B23K 2103/14* (2018.08); *B23K 2103/15* (2018.08); *B23K 2103/26* (2018.08); *B23K 2103/50* (2018.08); *B32B 2255/062* (2013.01); *B32B 2305/022* (2013.01); *C22C 2001/083* (2013.01); *F05D 2300/612* (2013.01); *F28F 1/12* (2013.01); *F28F 13/003* (2013.01)

(56) References Cited

U.S. PATENT DOCUMENTS

| | | | |
|---|---|---|---|
| 3,834,881 A | 9/1974 | Niebylski | |
| 4,042,746 A | 8/1977 | Hofer | |
| 5,112,663 A | 5/1992 | Morenz et al. | |
| 5,550,338 A | 8/1996 | Hielscher | |
| 5,594,216 A | 1/1997 | Yasukawa et al. | |
| 6,436,480 B1 * | 8/2002 | Upadhya | C23C 4/10 264/455 |
| 7,905,275 B2 | 3/2011 | Behrens et al. | |
| 8,887,864 B2 | 11/2014 | Sugimoto et al. | |
| 2002/0104405 A1 | 8/2002 | Haack et al. | |
| 2002/0121157 A1 | 9/2002 | Knott et al. | |
| 2003/0181303 A1 | 9/2003 | Leinonen et al. | |
| 2004/0226702 A1 * | 11/2004 | Toonen | F28F 13/003 165/164 |
| 2005/0208361 A1 | 9/2005 | Enjoji et al. | |
| 2006/0060421 A1 | 3/2006 | Sarin et al. | |
| 2006/0285975 A1 | 12/2006 | Landis | |
| 2007/0003806 A1 * | 1/2007 | Sarkar | F28D 9/04 429/440 |
| 2007/0079507 A1 * | 4/2007 | Cheng | F01D 5/005 29/889.1 |
| 2009/0274924 A1 | 11/2009 | Pelzer et al. | |
| 2009/0308571 A1 * | 12/2009 | Thompson | F28F 13/003 165/79 |
| 2010/0331173 A1 | 12/2010 | Ebener et al. | |
| 2011/0065022 A1 | 3/2011 | Min et al. | |
| 2011/0297269 A1 | 12/2011 | Pilon et al. | |
| 2012/0152454 A1 * | 6/2012 | Mass | H01P 3/121 156/280 |
| 2012/0167572 A1 | 7/2012 | Rice et al. | |
| 2014/0007983 A1 | 1/2014 | Prest et al. | |
| 2014/0021645 A1 | 1/2014 | Rayess et al. | |
| 2014/0103613 A1 | 4/2014 | Gomez | |
| 2014/0169943 A1 | 6/2014 | Bunker et al. | |
| 2015/0118441 A1 | 4/2015 | Shang et al. | |
| 2015/0292818 A1 * | 10/2015 | Wilding | F28F 13/003 165/173 |
| 2015/0323263 A1 | 11/2015 | Yanachi et al. | |

FOREIGN PATENT DOCUMENTS

| | | |
|---|---|---|
| DE | 102005004695 B3 | 9/2006 |
| DE | 102011078674 A1 | 1/2013 |
| EP | 0486427 | 5/1992 |
| EP | 1477578 A1 | 11/2004 |
| EP | 2019774 A1 | 2/2009 |
| EP | 2716868 A2 | 4/2014 |
| EP | 2811249 A1 | 12/2014 |
| EP | 2921649 A1 | 9/2015 |
| EP | 2977556 A1 | 1/2016 |
| JP | 2004360630 A | 12/2004 |
| RU | 2592871 C1 | 7/2006 |
| WO | 9833621 A1 | 8/1998 |
| WO | 2007134626 | 12/2004 |
| WO | 2007073592 A1 | 7/2007 |
| WO | 2007134626 A1 | 11/2007 |
| WO | 2011010874 A2 | 1/2011 |

OTHER PUBLICATIONS

European Search Report for Application No. EP 17 16 6353.
No Author et al: "Stabilitat vereint Leichtigkeit AFS-Einstoff-Aluminium-Sandwich Metal Foam: Weltweit Einzigartig Stabilitat vereint Leichtigkeit AFS-Einstoff-Aluminium-Sandwich", Mar. 4, 2016.
Partial EP Search Report for EP Application No. EP 17 16 6353.
Davies G. J. et al.: "Metallic Foam: Their Production, Properties and Applications", Journal of Materials Science, Kluwer Academic Publishers, vol. 18, No. 7.
European Search Report for Application No. EP 17 16 6366.
European Search Report Application No. EP 17 16 6368.
European Search Report for Application No. EP 17 16 6349.

(56) References Cited

OTHER PUBLICATIONS

European Search Report for Application No. EP 17 16 6371.
European Search Report for Application No. EP 17 16 6376.
European Search Report for EP Application No. 17 16 6220.
JP 2004-360630 Machine Translation, 13 pages, Dec. 24, 2004.
RU 2,592, 871 Machine Translation, 5 pages, Jul. 27, 2006.
EP Office Action dated Sep. 6, 2018 for Application No. 17 166 353.7.
EP Office Action dated Jul. 30, 2018 for Application No. 17 166 220.8.

* cited by examiner

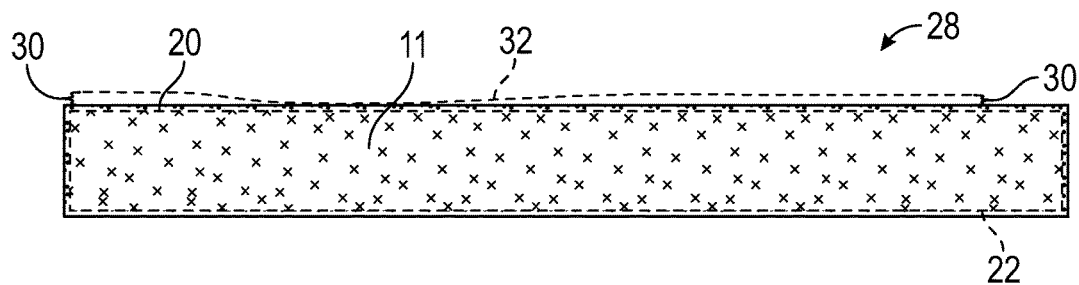
FIG. 8
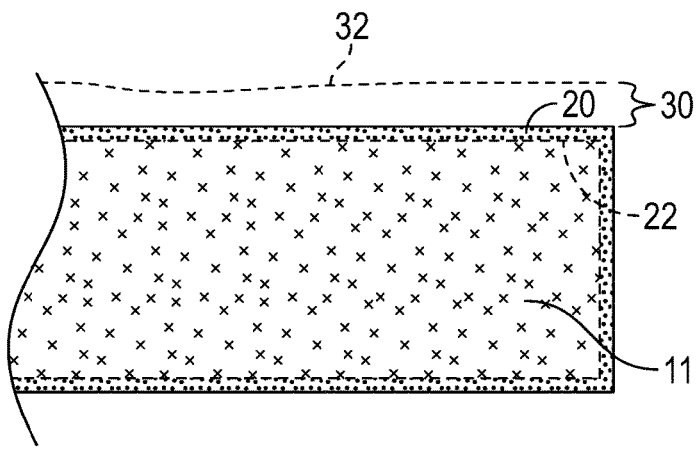
FIG. 8A
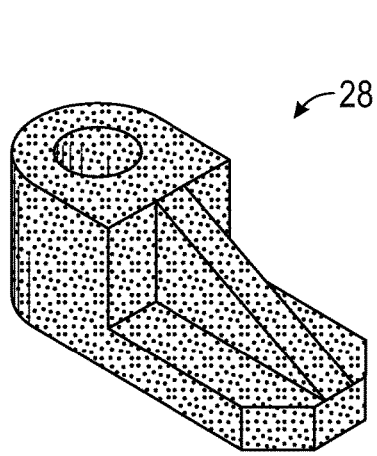      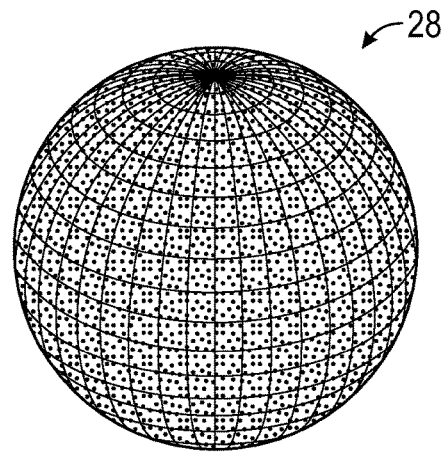
FIG. 9                FIG. 10

LIGHT WEIGHT HOUSING FOR INTERNAL COMPONENT AND METHOD OF MAKING

BACKGROUND

This disclosure relates generally to methods of making low cost, light weight components and components formed by the aforementioned methods. In particular, the present application is directed to a component formed from a composite of metallic foam and an external metallic shell. In addition, various embodiments of the present disclosure are also directed to methods for making such a component.

Commercially suitable components need to meet specific performance criteria. However, while a component may meet certain performance criteria it may be at the cost of other desirable factors such as component weight, time to manufacture and cost to manufacture. For example, subtractive manufacturing or machining oversized blocks, materials or forgings until a desired final part shape is achieved may be one process. However, and in this process, the monolithic nature of the raw input material means that the final part weight is driven by the final volume of the part and density of material used.

Accordingly, it is desirable to provide low cost, light weight components and components formed by such methods.

BRIEF DESCRIPTION

A method of making a light weight housing for an internal component is provided. The method including the steps of: forming a first metallic foam core into a desired configuration; forming a second metallic foam core into a desired configuration; inserting an internal component into the first metallic foam core; placing the second metallic foam adjacent to the first metallic core in order to secure the internal component between the first metallic foam core and the second metallic foam core; and applying an external metallic shell to an exterior surface of the first metallic foam core and the second metallic foam core.

In addition to one or more of the features described above, or as an alternative to any of the foregoing embodiments, further including the step of clamping the first metallic foam core and the second metallic foam core about the internal component.

In addition to one or more of the features described above, or as an alternative to any of the foregoing embodiments, wherein the metal of the metallic foam core is selected from the group comprising: titanium; cobalt; aluminum; nickel; steel alloys; magnesium; copper; molybdenum; niobium; tungsten; zinc alloys; titanium aluminide; nickel aluminide; and molybdenum disilicide.

In addition to one or more of the features described above, or as an alternative to any of the foregoing embodiments, wherein the metallic foam core is selected from the group comprising: an open cell structures and closed cell structures.

In addition to one or more of the features described above, or as an alternative to any of the foregoing embodiments, wherein the metallic foam core is formed into the desired configuration by a machining process selected from the group comprising: milling; grinding; electrical discharge machining (EDM); water-jet machining; and laser machining, wherein the desired configuration is slightly smaller than the final dimensions of the light weight component.

In addition to one or more of the features described above, or as an alternative to any of the foregoing embodiments, wherein the metallic foam core is a sheet of metallic foam and the sheet of metallic foam is formed into the desired configuration by a hot or cold forming process wherein the sheet of metallic foam is placed in a die.

In addition to one or more of the features described above, or as an alternative to any of the foregoing embodiments, wherein the metallic foam core is formed into the desired configuration by a machining process selected from the group comprising: milling; grinding; electrical discharge machining (EDM); water-jet machining; and laser machining after the hot or cold forming process.

In addition to one or more of the features described above, or as an alternative to any of the foregoing embodiments, wherein the external metallic shell is deposited on the exterior surface of the first metallic foam core and the second metallic foam core metallic foam core via an application process selected from the group comprising: flame spray application process; plasma spray application process; cold-spray application process; electron beam physical vapor deposition (EB/PVD), chemical vapor deposition (CVD); and electroplating application process, and wherein the external metallic shell is deposited about the entire exterior surface of the metallic foam core.

In addition to one or more of the features described above, or as an alternative to any of the foregoing embodiments, wherein an interim coat is deposited on the exterior surface of the first metallic foam core and the second metallic foam core prior to the application of the external metallic shell.

In addition to one or more of the features described above, or as an alternative to any of the foregoing embodiments, wherein the interim coat is a ceramic based thermal barrier coating.

In addition to one or more of the features described above, or as an alternative to any of the foregoing embodiments, further comprising the step of: heat treating the first metallic foam core and the second metallic foam core after the external metallic shell has been applied to the exterior surface of the metallic foam core.

In addition to one or more of the features described above, or as an alternative to any of the foregoing embodiments, further including the step of: forming additional features in the first metallic foam core and the second metallic foam core after the external metallic shell has been applied to the exterior surface of the metallic foam core.

In addition to one or more of the features described above, or as an alternative to any of the foregoing embodiments, wherein the additional features are formed by a drilling process.

In addition to one or more of the features described above, or as an alternative to any of the foregoing embodiments, wherein a supplemental application of the external metallic outer shell is applied to the first metallic foam core and the second metallic foam core after the drilling process.

In addition to one or more of the features described above, or as an alternative to any of the foregoing embodiments, wherein a thickness of the external metallic outer shell varies in order to provide localized structural rigidity to the housing.

In addition to one or more of the features described above, or as an alternative to any of the foregoing embodiments, wherein the internal component is a fluid conduit.

In addition to one or more of the features described above, or as an alternative to any of the foregoing embodiments, a housing formed by anyone of the above methods is provided.

In yet another embodiment, a method of making a light weight housing for an internal component is provided. The method including the steps of: forming a first metallic foam core into a desired configuration, wherein the first metallic foam core has a first recessed pocket; forming a second metallic foam core into a desired configuration, wherein the second metallic foam core has a second recessed pocket; inserting an internal component into the first recessed pocket of the first metallic foam core; placing the second metallic foam adjacent to the first metallic, wherein the internal component is received within the first recessed pocket and the second recessed pocket and is located between the first metallic foam core and the second metallic foam core; and applying an external metallic shell to an exterior surface of the first metallic foam core and the second metallic foam core.

In addition to one or more of the features described above, or as an alternative to any of the foregoing embodiments, wherein the metallic foam core is formed into the desired configuration by a machining process selected from the group comprising: milling; grinding; electrical discharge machining (EDM); water-jet machining; and laser machining, and wherein the external metallic shell is selectively applied to vary the thickness of the external metallic shell in order to provide localized structural rigidity to the housing.

In yet another embodiment, a housing is provided. The housing including: a first metallic foam core having a desired configuration; a second metallic foam having a desired configuration complementary to the desired configuration of the first metallic foam core; an internal component located between the first metallic foam core and the second metallic foam core; and an external metallic shell located an exterior surface of the first metallic foam core and the second metallic foam core, the external metallic shell securing the first metallic foam core to the second metallic foam core.

BRIEF DESCRIPTION OF THE DRAWINGS

The subject matter which is regarded as the present disclosure is particularly pointed out and distinctly claimed in the claims at the conclusion of the specification. The foregoing and other features, and advantages of the present disclosure are apparent from the following detailed description taken in conjunction with the accompanying drawings in which:

FIG. 8 is a cross-sectional view of a portion of the formed or machined metallic foam of FIG. 6 or 7;

FIG. 8A is an enlarged cross-sectional view of a portion of the formed or machined metallic foam of FIG. 6 or 7;

FIGS. 9 and 10 are non-limiting examples of components formed by the methods of the present disclosure;

DETAILED DESCRIPTION

Various embodiments of the present disclosure are related to methods of making low cost, light weight components and components formed by the aforementioned methods. In particular, the present application is directed to a component having an internal foam core, which in one embodiment may be a metallic foam core or alternatively a non-metallic foam core such as a ceramic foam core or any other non-metallic foam core and an external metallic shell surrounding the metallic or non-metallic foam core and methods for making such a component.

The present disclosure is directed to a method of making a component using a combination of subtractive and additive manufacturing processes. In general, the method starts with a metallic foam core using alloy and foam density that is compatible with a specific design application. As mentioned above and in alternative embodiments, the foam core may be non-metallic. The metallic foam core is then machined or formed to a shaped pre-form for subsequent manufacturing steps. After the metallic foam core is formed to the desired shape, a metallic skin is applied to the external surface of the metallic foam core creating a light-weight, rigid structure which can have characteristics similar to existing non-metallic foam core or metallic or non-metallic honeycomb components. After the metallic skin is applied a final machining of the component may occur wherein dimensional characteristics and/or features are added to the component.

Figure 1:
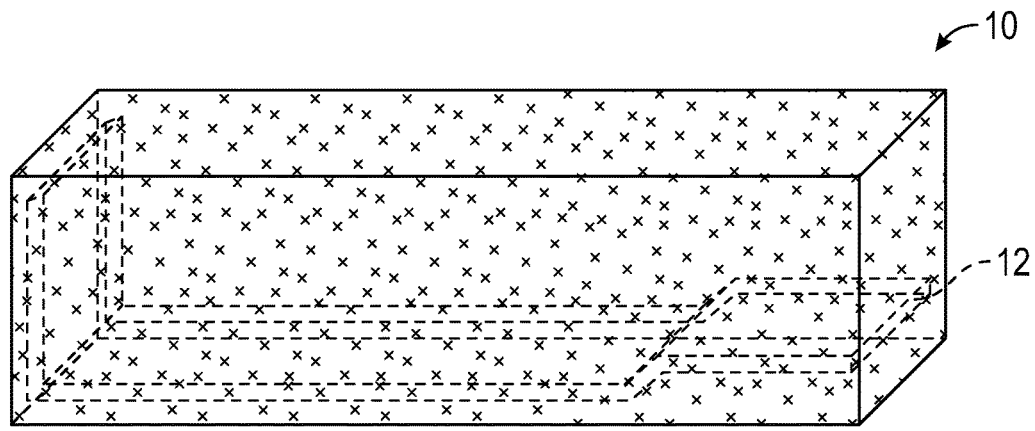
FIG. 1 is a perspective view of an un-machined block of metallic foam.

Referring now to FIG. 1, an unformed block of metallic foam 10 is illustrated. The block of metallic foam 10 may be formed from any suitable metal either commercially pure or alloy including but not limited to the following: titanium (including Ti 6-4, Ti 6-2-4-2, beta phase alloys including Beta 21s), cobalt, aluminum, nickel (including Inconel 625, Inconel 718), steel alloy, magnesium, copper, molybdenum, niobium, tungsten and zinc alloys as well as intermetallic alloys including titanium aluminide, nickel aluminide and molybdenum disilicide and equivalents thereof. In general, a metallic foam may be referred to as a cellular structure comprising a solid metal with a large volume fraction of pores. These pores may be sealed (closed-cell foam) or interconnected (open-cell foam). In one non-limiting embodiment, the porosity of the foam may be within the range of 5% to 80%. Of course, ranges of porosity greater or less than the aforementioned range are considered to be with the scope of various embodiments of the present disclosure. Selection of the porosity of the metallic foam may be dependent upon the ultimate end use of the component to be formed. For example and in some applications, it may be desirable to have a more porous foam core or a less porous foam core. The metallic foam block 10 is large enough to contain a desired part or component geometry 12 illustrated by the dashed lines 12 in FIG. 1.

Figure 2:
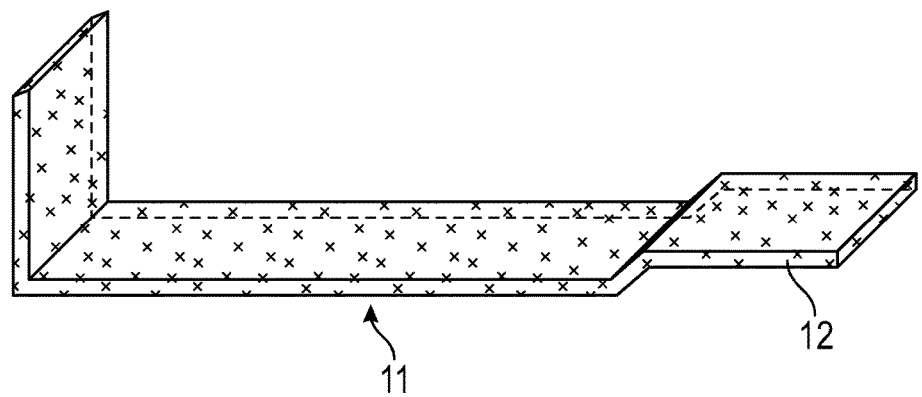
FIG. 2 is a perspective view of a machined block of metallic foam.

In FIG. 2, the block of metallic foam 10 has been machined into a foam core 11 having the desired interim part or interim component geometry 12 via any suitable process. As used herein interim part or interim component geometry may be referred to as being slightly smaller than the final part or component geometry in order to account for the applied external metallic shell 20. In some applications, it may be desirable to form the metallic foam core to near net shape as part of the initial foam manufacturing process. Examples of machining processes include but are not limited to milling, grinding, electrical discharge machining (EDM), water-jet machining, laser machining, combinations thereof or any other process capable of machining the block 10 into the metallic foam core 11 having the component geometry 12.

Figure 3:
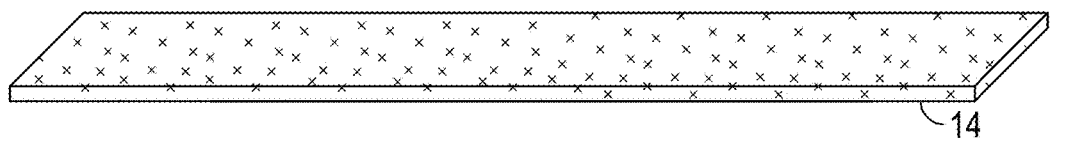
FIG. 3 is a perspective view of an un-formed sheet of metallic foam.
Figure 3A:
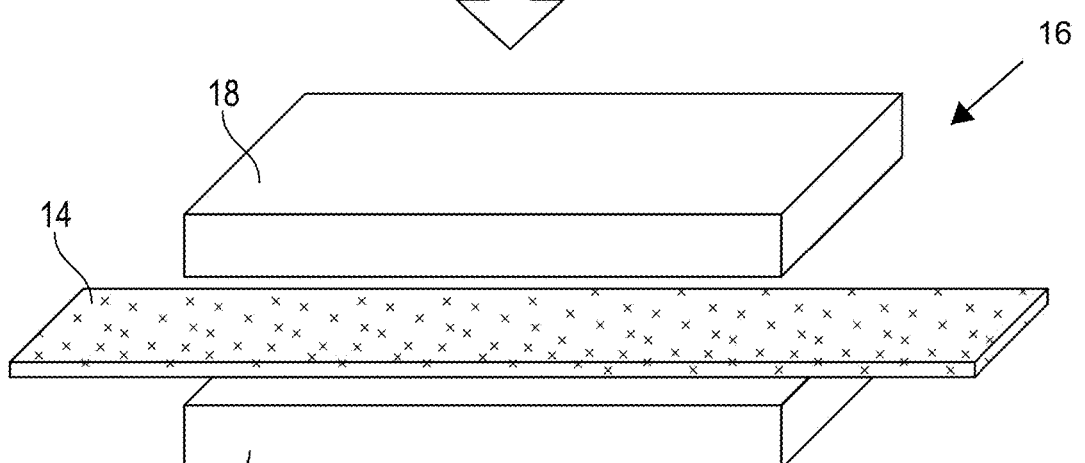
FIG. 3A is a perspective view of the un-formed sheet of metallic foam placed in a die for forming the un-formed sheet of metallic foam.
Figure 4:
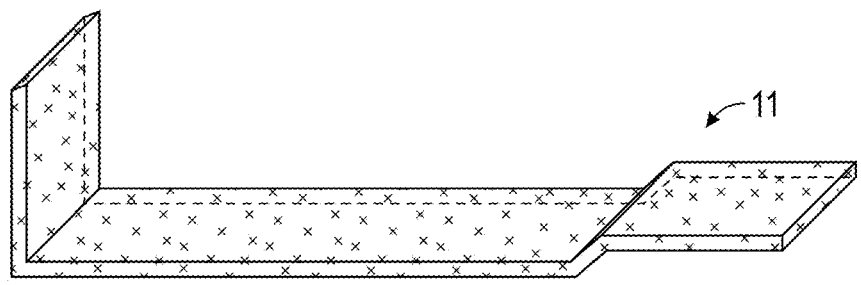
FIG. 4 is a perspective view of a formed sheet of metallic foam.

Alternatively and as illustrated in FIGS. 3, 3A and 4, a sheet of metallic foam 14 may be provided. In this alternative process, the sheet of metallic foam 14 is formed into the foam core 11 having the desired part or component geometry 12 via a hot or cold forming process wherein the sheet of metallic foam 14 is placed in a die 16. The die 16 may include a pair of complementary halves 18 configured to form the desired part or component geometry 12. In alternative embodiments, the die 16 may have more than one pair of elements or die halves 18.

The formed component or metallic core 11 is illustrated in FIG. 4. The formed sheet of metallic foam may be further shaped to a final configuration using the aforementioned machining processes such as milling, electrical discharge machining (EDM), water-jet machining, laser machining, combinations thereof or any other process capable of machining the formed sheet of metallic foam.

Figure 5:
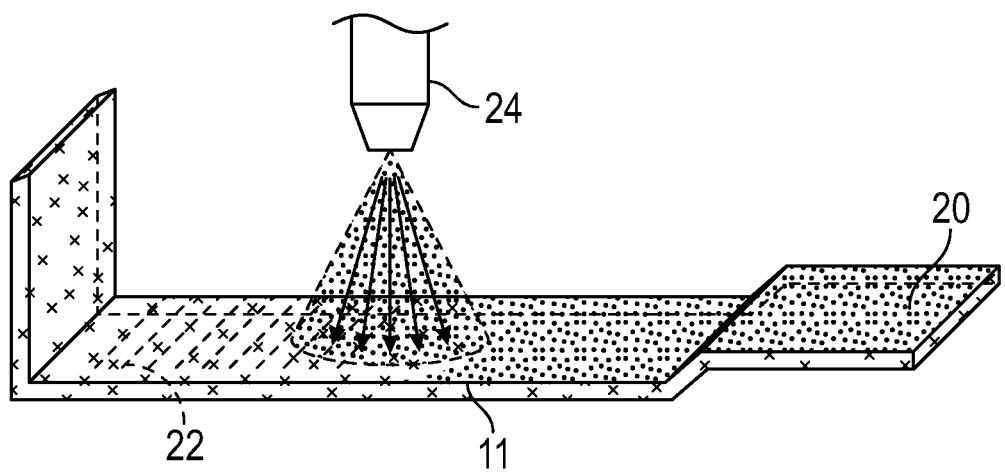
FIG. 5 illustrates the application of an external metallic shell to the formed or machined metallic foam of FIG. 2 or 4.

Referring now to at least FIG. 5, the formed metallic foam core 11 from any of the aforementioned processes (machining, forming or combinations thereof) depicted in at least FIGS. 1-4, has an external metallic shell 20 deposited on the exterior surface of the formed metallic foam core 11. In one embodiment, the external metallic shell 20 is deposited about the entire exterior surface of the formed metallic foam core 11. Alternatively, discrete areas of the formed metallic foam core may be masked such that the external metallic shell 20 is prohibited from covering certain areas. The external metallic shell 20 may also be referred to as an outer reinforcing metallic skin 20. Accordingly, the metallic foam pre-form or core 11 is used as a base for application of the external metallic shell 20. Depending on the initial foam cell size and material being deposited as well as the deposition method, it may be permissible to have an interim coat or applique to form a non-porous intermediate layer for metallic deposition. In this embodiment, the interim coat is first applied and then the external metallic shell 20 is applied to the metallic foam pre-form or core 11. In FIG. 5, the interim coat is illustrated by the dashed lines 22. The external metallic shell 20 is a metallic material chemically and metalurgically compatible with that of the metallic foam and the external metallic outer shell 20 may be applied via any suitable methods including but not limited to the following application processes: flame spray application; plasma spray application; cold-spray application; electron beam physical vapor deposition (EB/PVD), chemical vapor deposition (CVD), electroplating, additive manufacturing (including but not limited to electron beam melt, etc.) or any other suitable means. The external metallic outer skin can be made of any of the same alloys listed in the core section which includes but is not limited to titanium (including Ti 6-4, Ti 6-2-4-2, beta phase alloys including Beta 21s), cobalt aluminum, nickel (including Inconel 625, Inconel 718), steel alloy, magnesium, copper, molybdenum, niobium, tungsten and zinc alloys as well as intermetallic alloys including titanium aluminide, nickel aluminide and molybdenum disilicide and equivalents thereof. The material used in the external metallic outer skin may be the same or may be different than that used in the foam core depending on the metallurgical compatibility of the outer skin to the foam core. In addition and in some instances when a different alloys is used for the external skin 20 as opposed to that used for the foam core, one or more intermediate alloys may be used as interim coat or coats 22 covering portions or all of the part to bridge the compatibility of the core alloy 11 and the outermost skin alloy 20.

Other non-metallic materials may be deposited in place of or in addition to the metallic coatings, these coatings may include ceramic based thermal barrier coatings.

Figure 6:
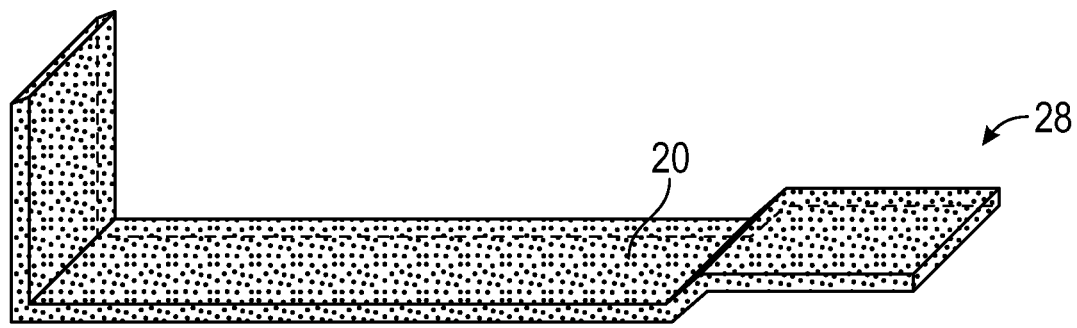
FIG. 6 illustrates the formed or machined metallic foam of FIG. 2 or 4 with an applied external metallic shell.

In FIG. 5, a nozzle 24 is illustrated and in one embodiment, the nozzle 24 may be used in conjunction with a plasma spray application process. Once the external metallic outer shell 20 is applied to the exterior surface of the metallic foam pre-form or core 11, this part, as illustrated in FIG. 6, is inspected for surface coverage and may be further subjected to a heat treating step in order to relieve residuals stresses imparted by manufacturing and outer skin deposition processes and/or to provide desired final material properties. In applications where the foam core is an open cell structure, the outer skin may be perforated with a plurality of venting holes to allow for internal air to escape from the part as it is heated during the heat treating step. In one embodiment, the venting holes may be sealed after the heat treating step and in other embodiments, the venting holes may be subsequently sealed after the heat treating step.

Figure 7:
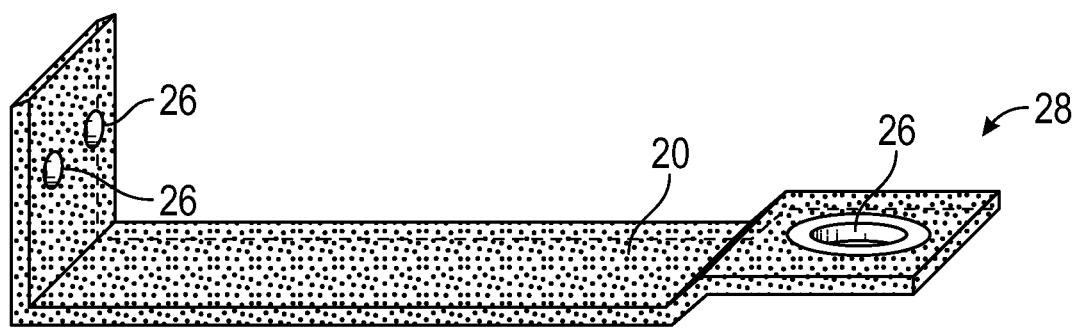
FIG. 7 illustrates the formed or machined metallic foam of FIG. 6 with additional features formed therein.

At the next step, additional features 26 are introduced to the coated metallic foam pre-form or core 11 in order to form the desired part or component 28. These additional features may be added by any suitable process such as milling, spot-face drilling, counter-bore drilling, conventional drilling, etc. In FIG. 7, the features 26 are illustrated as openings, of course, any other configurations are considered to be within the scope of various embodiments of the present disclosure. Still further and in the event that the drilling process removes some of the external metallic outer shell 20 and the metallic foam is exposed, a supplemental application process of the external metallic outer shell 20 may be employed to cover the exposed metallic foam. In yet another embodiment, the part 28 may not require any additional features 26 to be added. In one non-limiting embodiment, the component 28 may comprise the formed metallic core 11, an applied external metallic shell 20 and if applicable feature 26 as well as an intermediary layer 22 located between an external surface of the formed metallic core 11 and the applied external metallic shell 20.

Since the external metallic outer shell 20 is applied via a process wherein the localized thickness of the external metallic outer shell 20 may vary with respect to other locations, the thickness of the external metallic outer shell 20 on the exterior of the part may be tailored in thickness, pattern and orientation to provide preferential strength and thus the part or component 28 may have localized structural features such as ribs or gussets, which are provided by the applied external metallic outer shell 20.

For example and referring at least to the cross-sectional view of FIGS. 8 and 8A, a thickness 30 of the external metallic outer shell 20 may vary. In FIG. 8, the dashed line 32 is provided to illustrate the varying thickness of the external metallic outer shell 20 that surrounds the internal metallic foam core 11. Also shown in FIGS. 8 and 8A is the intermediary layer 22, which may or may not be applied prior to the application of the external metallic outer shell 20.

In yet another implementation and for parts designed to be capable of bending in certain areas over others, the applied metallic skin on the external surface of the formed part in some applications places the load carrying material away from a neutral axis of the part for high structural efficiency.

In accordance with various embodiments of the present disclosure, machining or forming of the metallic foam core 11 can be done very quickly and at lower expense than machining a solid block of material. This will result in a significant reduction in raw material waste vs. machining processes applied to solid blocks of material. In addition, the metallic deposition on the outside of foam core may be tailored in thickness to provide preferential strength.

FIGS. 9 and 10 illustrate non-limiting examples of a part or component 28 formed by the various methods of the present disclosure. Some additional non-limiting examples of contemplated components or parts include brackets, housings, ducts, liner assemblies, (commercial engine tail cones, nozzles, etc.). In one non-limiting embodiment, the part or component 28 may be an aviation component. In another embodiment, the component may be used in any application where the component weight and cost are key design constraints.

Referring now to FIGS. 11-20, an alternative embodiment of the present disclosure is illustrated. In this embodiment, it may be desirable to provide the formed component 28 with more complex functionality. As will be discussed herein, this embodiment contemplates integrating one or more components into a single or multi-section (multi version shown) of machined metallic foam pre-form and then applying a metallic outer skin to yield a low-cost, lightweight part with the desired functionality.

In the illustrated example, high pressure fluid distribution is desired. Accordingly, one or multi-pieces of the metallic foam pre-form are machined to accept the component and provide the desired external contour. The component(s) to be integrated are positioned in or on the metallic foam pre-form prior to the application of a metallic skin that consolidates the assembly.

As such, this embodiment offers a low-cost, light-weight option to solid castings, machined components for valve bodies and other applications. Metallic foam pre-forms are extremely fast and easy to machine and result in less raw material waste to create desired part geometry versus machining form a solid block of material. Internal features can provide fluid flow or other functional characteristics by integrating one or more components into the structure and the final configuration with the applied metallic outer skin may provide attachment of the components and the required structural capability, etc.

Figure 11:
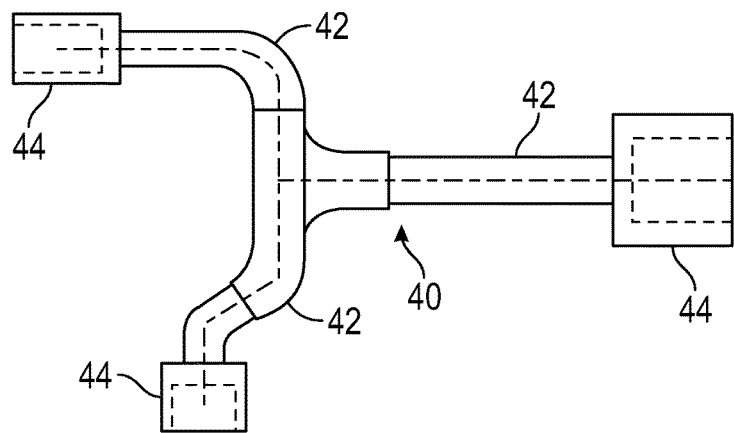
FIGS. 11 and 12 illustrate housing segments formed in accordance with an alternative embodiment of the present disclosure.
Figure 12:
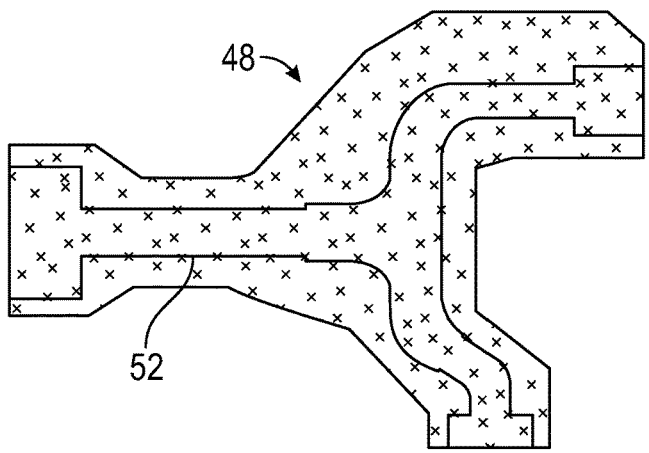
Figure 13:
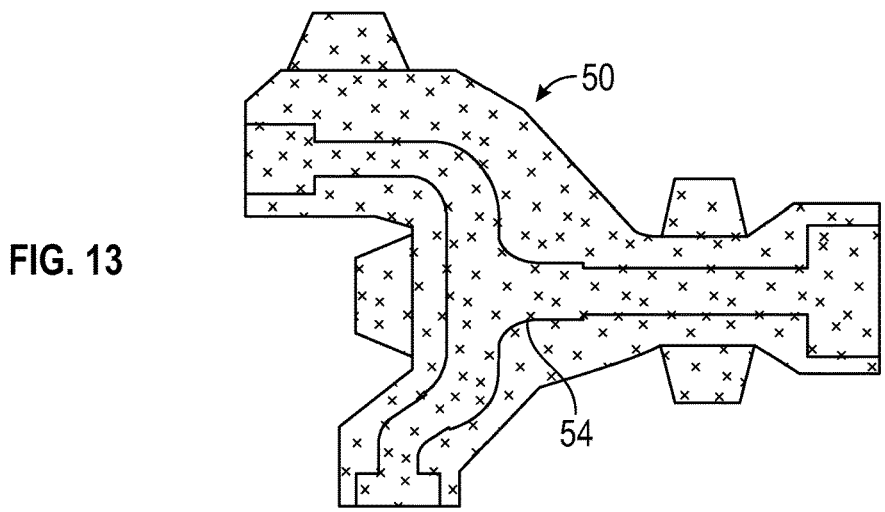
FIG. 13 illustrates a component to be placed in the housing segments illustrated in FIGS. 11 and 12.
Figure 14:
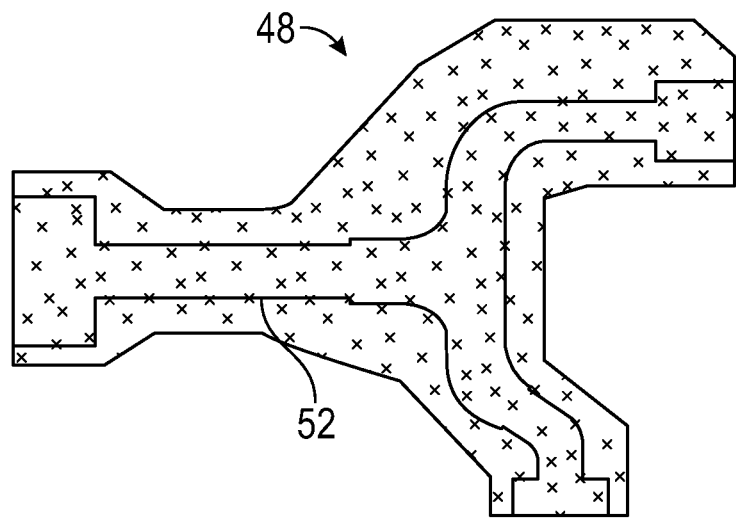
FIGS. 14 and 15 illustrate the assembly of the housing with its internal component in accordance with an embodiment of the present disclosure.

For example and referring now to FIG. 11 an internal component 40 for integration into the metallic foam core 11 is illustrated. In the illustrated embodiment component 40 is a tube manifold having a plurality of fluid conduits 42 and a plurality of fittings 44. The fittings 44 may be final machined or have a rough configuration that may require additional machining steps. In this embodiment, the metallic foam core 11 is a housing 46 (see at least FIGS. 16-20). For example and referring to FIGS. 12 and 13, the block 10 or the sheet 14 of the metallic foam is formed into a first or upper foam pre-form 48 configured to mate with a complementary second or lower pre-form 50 also formed from a block 10 or sheet 14 of metallic foam. Accordingly, the first or upper foam pre-form 48 is configured to mate with the second or lower pre-form 50. In addition, each of these pre-forms will have a recessed pocket configured to allow for the internal component 40 to be inserted therein prior to the application of the external metallic outer shell 20. The recessed pockets of the first or upper foam pre-form 48 and the second or lower pre-form 50 are formed in the metallic foam using any of the aforementioned forming processes (e.g., machining and/or forming). As illustrated, the first or upper pre-form 48 has a first recessed pocket 52 while the second or lower pre-form 50 has a second recessed pocket 54 that is complementary to the first recessed pocket 52 such that when the internal component 40 is placed in one of the recessed pockets 52, 54 and the first or upper pre-form 48 is mated with the second or lower pre-form 50, the internal component 40 is substantially surrounded by the metallic foam.

Figure 15:
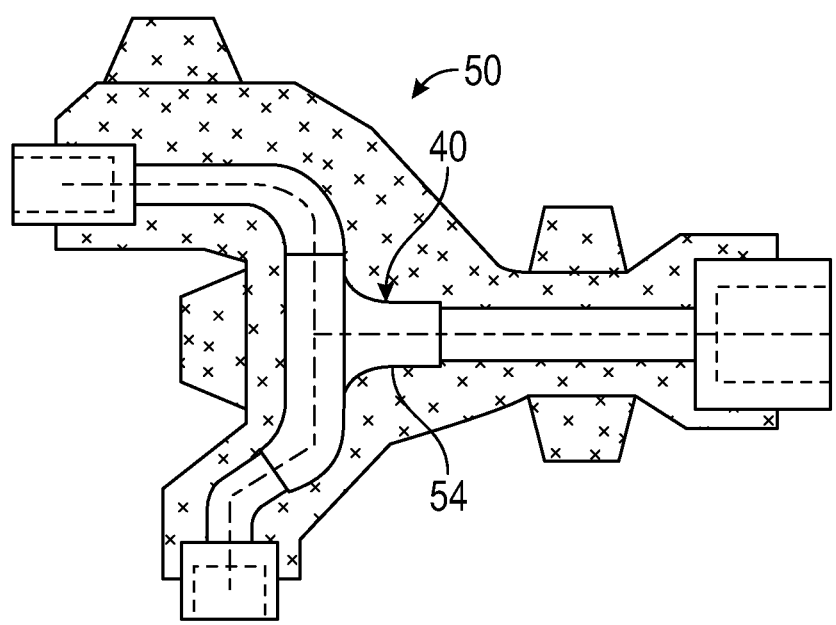
Figure 16:
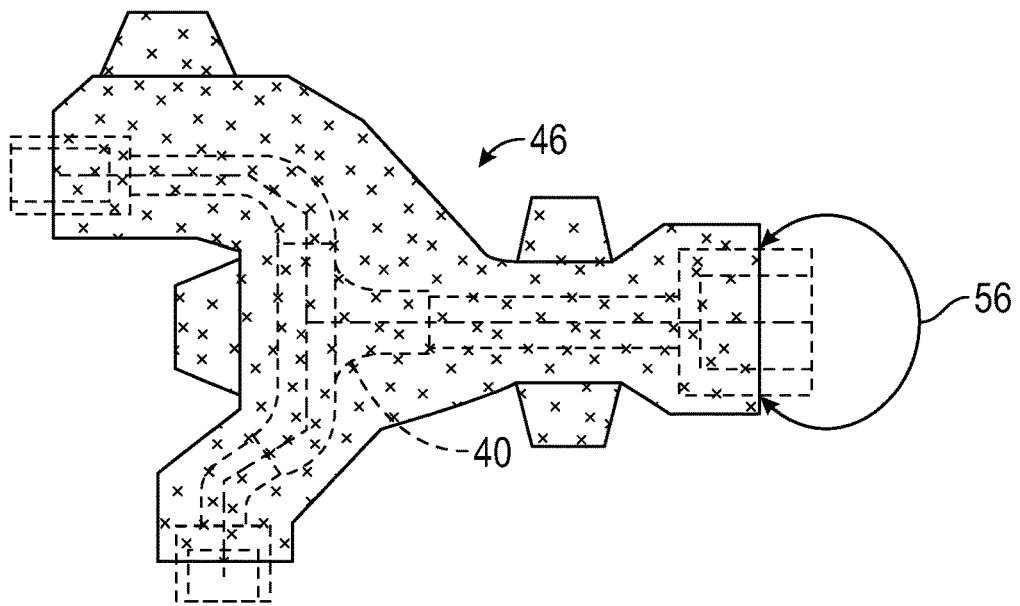
FIG. 16 illustrates the assembled housing prior to the application of the outer reinforcing metallic skin.

For example, FIG. 15 illustrates the internal component 40 positioned in the recessed pocket 54 of the second or lower pre-form 50. FIG. 16 illustrates the first or upper pre-form 48 applied to the second or lower pre-form 50 after the internal component 40 has been positioned in the recessed pocket 54. Accordingly, the internal component 40 is now essentially surrounded by the metallic foam except for portions of the fittings 44 which extend outwardly from the periphery of the housing 46 formed by the first or upper pre-form 48 and the second or lower pre-form 50. Once the first or upper pre-form 48 and the second or lower pre-form 50 are positioned adjacent to each other and about the internal component 40, the first or upper pre-form 48 and the second or lower pre-form 50 are now ready to have their exterior surfaces covered with the external metallic shell 20, which may be applied via any of the aforementioned application processes. As mentioned above, the external metallic shell 20 may provide structural reinforcement to the housing 46 and the thickness of the external metallic outer shell may vary in order to provide localized structural rigidity to the housing 46 as well.

Figure 17:
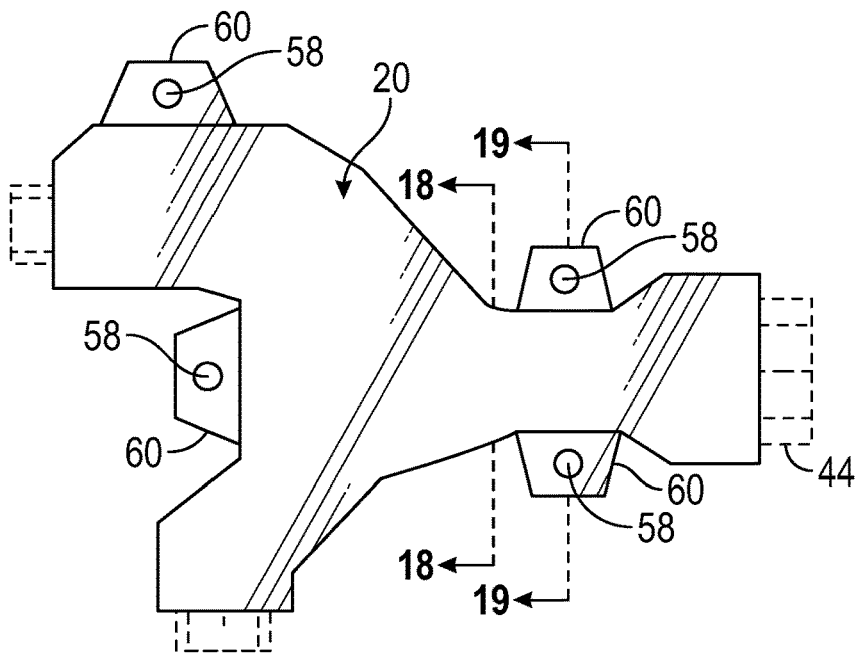
FIG. 17 illustrates the assembled housing with the applied outer reinforcing metallic skin.

FIG. 17 illustrates the external metallic shell 20 applied to the first or upper pre-form 48 and the second or lower pre-form 50 after they have been placed about the internal component 40. In order to prevent the portions of the fluid fittings 44 that extend from the periphery of the housing 46 from being coated with the external metallic shell 20, a removable masking 56 (see at least FIG. 16) may be applied prior to the application of the external metallic shell 20.

After the external metallic shell 20 has been applied, attachment features or openings 58 may be formed in flanged portions 60 of the housing 46. As mentioned above, these attachment features or openings 58 may be formed after the application of the external metallic shell 20.

Figure 18:
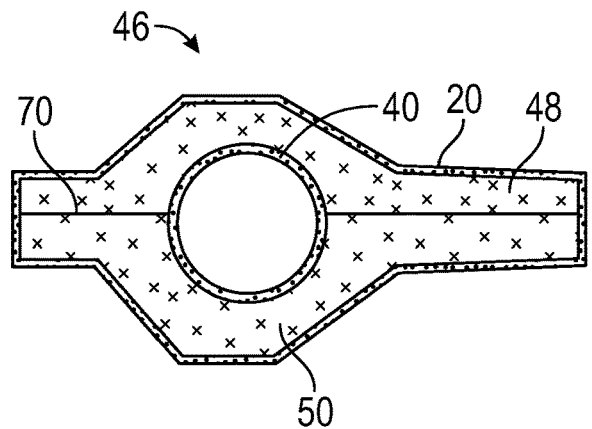
FIG. 18 is a cross-sectional view along lines 18-18 of FIG. 17.

FIG. 18 is a cross-sectional view of the housing 46 along lines 18-18 of FIG. 17. As illustrated, external metallic shell 20 surrounds the first or upper pre-form 48 and the second or lower pre-form 50 of the metallic foam. Also illustrated is the upper to lower metallic foam pre-form split line 70 between pre-form 48 and pre-form 50 as well as recessed pockets 52, 54. In an alternative embodiment, the first or upper pre-form 48 or the second or lower pre-form 50 may have a recessed pocket that is configured to receive the majority of the internal component 40 therein and the complementary pre-form applied thereto simply is configured to cover the internal component 40 without requiring a recessed pocket.

Figure 19:
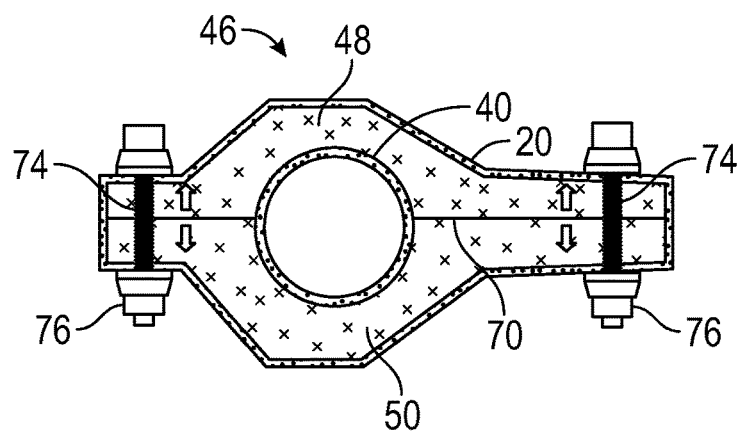
FIG. 19 is a cross-sectional view along lines 19-19 of FIG. 17 according to an embodiment.

Referring now to FIG. 19, which is a cross-sectional view of the housing 46 along lines 19-19 of FIG. 17, fasteners 72 configured for insertion into openings 58 are illustrated. In one non-limiting embodiment, fasteners 72 may comprise a bolt 74 and a complementary nut 76, which when secured in openings 58 provide additional clamping to housing 46 if necessary. It is, of course, understood that features 58 and fasteners 72 are optional and embodiments of the present disclosure are contemplated wherein the external metallic outer shell 20 provides the necessary clamping of the metallic foam cores about the internal component 40.

Figure 20:
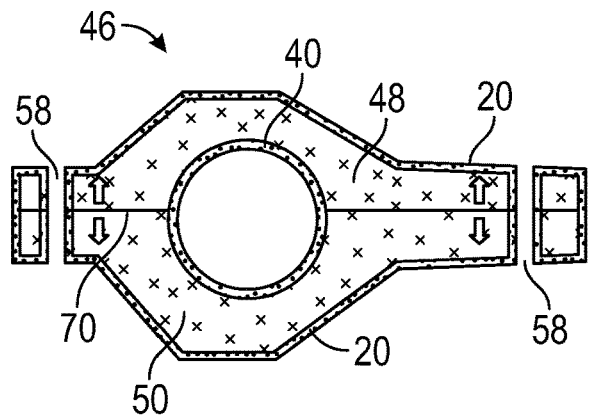
FIG. 20 is a cross-sectional illustrating an alternative embodiment of the present disclosure.

Referring now to FIG. 20 yet another alternative embodiment of the present disclosure is illustrated. In this embodiment, the external metallic outer shell 20 is also applied to the internal surfaces of the openings 58. In this embodiment, the external metallic outer shell 20 applied to the internal surfaces of openings 58 may provide additional structural reinforcement if necessary.

Figure 21:
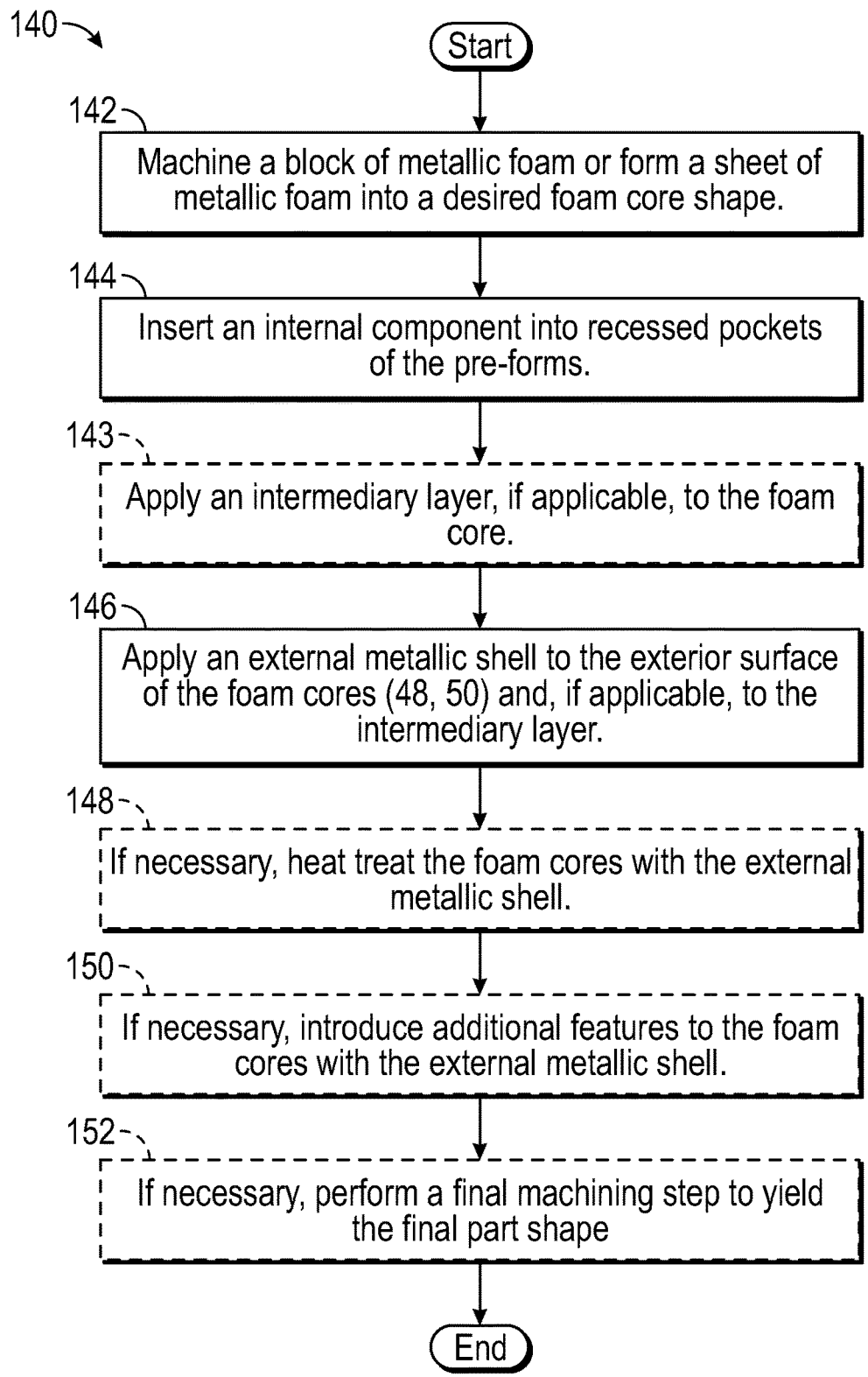
FIG. 21 is a flow chart illustrating a method of making a component according to non-limiting methods of the present disclosure.

Referring now to FIG. 21 a flow chart 140 illustrating a method for forming a part or component 46 in accordance with various embodiments of the present disclosure is illustrated. At a first step 142, an unformed block of metallic foam 10 is machined to foam core 11, which as discussed above may comprise a first or upper pre-form 48 and a second or lower pre-form 50 each having complementary recessed pockets 52, 54 configured to surround an internal component 40 when it is surrounded by the first or upper pre-form 48 and the second or lower pre-form 50. As mentioned above, non-limiting machining processes include milling, electrical discharge machining (EDM), water-jet machining, laser machining, combinations thereof or any other process capable of machining the block 10 into the metallic foam core having the desired geometry. Alternatively and at the first step 142, a sheet of metallic foam 14 may be provided and the sheet of metallic foam 14 is formed into the foam cores having the desired geometry via a hot or cold forming process wherein the sheet of metallic foam 14 is placed into a die 16. The die 16 may include a pair of complementary halves 18 configured to form the desired part or component geometry. The formed sheet of metallic foam may be further shaped to a final configuration using the aforementioned machining processes.

Thereafter and at step 144, an internal component 40 is inserted into the recessed pockets 52, 54 of the first or upper pre-form 48 and a second or lower pre-form 50.

Thereafter and at step 146, an external metallic shell 20 is deposited on the exterior surface of the first or upper pre-form 48 and the second or lower pre-form 50. As a precursor to step 146, an interim coat or applique may be applied to the exterior surfaces of the first or upper pre-form 48 and the second or lower pre-form 50 prior to the application of the external metallic shell 20. This is illustrated as alternative step 143, which is illustrated in dashed lines. As mentioned above, the external metallic outer shell 20 may be applied via any one of the aforementioned processes including but not limited to: flame spray application; plasma spray application; cold-spray application; electron beam physical vapor deposition (EB/PVD), chemical vapor deposition (CVD), electroplating, additive manufacturing (including but not limited to electron beam melt, etc.) or any other suitable means.

Once the external metallic outer shell 20 is applied to the exterior surface of the first or upper pre-form 48 and the second or lower pre-form 50 the housing 46 defined by the first or upper pre-form 48 and the second or lower pre-form 50 and its external metallic outer shell 20 may be further subjected to a heat treating step 148, which is illustrated in dashed lines as this step may not be required in all processes.

At step 150, additional features 58, if required, are introduced to the housing 46. These additional features may be added by any suitable process such as milling, spot-face drilling, counter-bore drilling, conventional drilling, etc. Still further and in the event that the drilling process removes some of the external metallic outer shell 20 and the metallic foam is exposed, a supplemental application process of the external metallic outer shell 20 may be employed to cover the exposed metallic foam. In yet another embodiment, the housing 46 may not require any additional features 58 to be added. In addition and as illustrated by the dashed lines in FIG. 21, an alternative step 152 may be provided wherein a final machining step of any key attachment, interface or functionally critical surfaces of the part or component occurs after step 150. This would yield the final part shape.

As discussed herein various methods for producing light weight, low cost components and/or parts are provided. Still further components and/or parts formed by the various methods are also provided.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. A method of making a housing for an internal component to be received within the housing, comprising:
   forming a first metallic foam core into a first pre-form;
   forming a second metallic foam core into a second pre-form, the first pre-form being configured to mate with the second pre-form;
   inserting the internal component into the first metallic foam core after it has been formed into the first pre-form, wherein the first pre-form and the second pre-form are configured to surround the internal component and wherein the internal component is a tube manifold;
   placing the second pre-form adjacent to the first pre-form in order to secure the internal component between the first pre-form and the second pre-form; and
   applying an external metallic shell to an exterior surface of the first pre-form and the second pre-form after placing the second pre-form adjacent to the first pre-form.

2. The method as in claim 1, further comprising: clamping the first pre-form and the second pre-form about the tube manifold.

3. The method as in claim 1, wherein the metal of the metallic foam cores is selected from the group comprising: titanium; cobalt; aluminum; nickel; steel alloys; magnesium; copper; molybdenum; niobium; tungsten; zinc alloys; titanium aluminide; nickel aluminide; and molybdenum disilicide.

4. The method as in claim 1, wherein the metallic foam cores are selected from the group comprising: open cell structures and closed cell structures.

5. The method as in claim 1, wherein the metallic foam cores are formed into the pre forms by a machining process selected from the group comprising: milling; grinding; electrical discharge machining (EDM); water-jet machining; and laser machining, wherein the pre-forms are slightly smaller than the final dimensions of the housing.

6. The method as in claim 1, wherein the metallic foam cores each comprise a sheet of metallic foam and the sheet of metallic foam is formed into the pre-form by a hot or cold forming process wherein the sheet of metallic foam is placed in a die.

7. The method as in claim 6, wherein the metallic foam cores are formed into the pre forms by a machining process selected from the group comprising: milling; grinding; electrical discharge machining (EDM); water-jet machining; and laser machining after the hot or cold forming process.

8. The method as in claim 1, wherein the external metallic shell is deposited on the exterior surface of the first pre-form and the second pre-form via an application process selected from the group comprising: flame spray application process; plasma spray application process; cold-spray application process; electron beam physical vapor deposition (EB/PVD), chemical vapor deposition (CVD); and electroplating application process, and wherein the external metallic shell is deposited upon the entire exterior surface of the pre-forms.

9. The method as in claim 1, wherein an interim coat is deposited on the exterior surface of the first pre-form and the second pre-form prior to the application of the external metallic shell.

10. The method as in claim 9, wherein the interim coat is a ceramic based thermal barrier coating.

11. The method as in claim 1, further comprising the step of: heat treating the first pre-form and the second pre-form after the external metallic shell has been applied to the exterior surface of the pre-forms.

12. The method as in claim 1, further comprising the step of: forming additional features in the first pre-form and the second pre-form after the external metallic shell has been applied to the exterior surface of the pre-forms.

13. The method as in claim 12, wherein the additional features are formed by a drilling process.

14. The method as in claim 13, wherein a supplemental application of the external metallic outer shell is applied to the first pre-form and the second pre-form after the drilling process.

15. The method as in claim 1, wherein a thickness of the external metallic outer shell varies in order to provide localized structural rigidity to the housing.

16. The method as in claim 1, wherein the tube manifold is a fluid conduit.

17. A method of making a housing for an internal component to be received within the housing, comprising:
forming a first metallic foam core into a first pre-form, wherein the first pre-form has a first recessed pocket;
forming a second metallic foam core into a second pre-form, wherein the second pre-form has a second recessed pocket;
inserting the internal component into the first recessed pocket of the first pre-form after it has been formed into the first pre-form, wherein the first pre-form and the second pre-form are configured to surround the internal component and wherein the internal component is a tube manifold;
placing the second pre-form adjacent to the first pre-form, wherein the internal component is received within the first recessed pocket and the second recessed pocket and is located between the first pre-form and the second pre-form; and
applying an external metallic shell to an exterior surface of the first pre-form core and the second pre-form after placing the second pre-form adjacent to the first pre-form.

18. The method as in claim 17, wherein the metallic foam cores are formed into the pre forms by a machining process selected from the group comprising: milling; grinding; electrical discharge machining (EDM); water jet machining; and laser machining, and wherein the external metallic shell is selectively applied to vary the thickness of the external metallic shell in order to provide localized structural rigidity to the housing.

* * * * *